(12) United States Patent
Giusti et al.

(10) Patent No.: US 11,807,519 B2
(45) Date of Patent: Nov. 7, 2023

(54) MICROELECTROMECHANICAL MEMBRANE TRANSDUCER WITH ACTIVE DAMPER

(71) Applicant: STMICROELECTRONICS S.r.l., Agrate Brianza (IT)

(72) Inventors: Domenico Giusti, Caponago (IT); Fabio Quaglia, Pizzale (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 2 days.

(21) Appl. No.: 17/337,296

(22) Filed: Jun. 2, 2021

(65) Prior Publication Data
US 2021/0395075 A1    Dec. 23, 2021

(30) Foreign Application Priority Data
Jun. 23, 2020 (IT) .......... 102020000015073

(51) Int. Cl.
*B81B 7/00* (2006.01)
*B81C 1/00* (2006.01)
*F16F 15/00* (2006.01)

(52) U.S. Cl.
CPC ........ *B81B 7/0016* (2013.01); *B81C 1/00825* (2013.01); *F16F 15/007* (2013.01); *B81B 2203/0118* (2013.01); *B81B 2203/0127* (2013.01); *B81B 2203/0307* (2013.01); *B81B 2207/03* (2013.01); *B81C 2203/032* (2013.01); *F16F 2226/042* (2013.01)

(58) Field of Classification Search
CPC ... H01L 41/1138; F16F 15/007; H10N 30/308
See application file for complete search history.

(56) References Cited

U.S. PATENT DOCUMENTS

| | | |
|---|---|---|
| 8,896,184 B2 | 11/2014 | Grosh et al. |
| 8,958,595 B2 | 2/2015 | Hwang et al. |
| 9,386,379 B2 | 7/2016 | Sparks et al. |
| 10,034,097 B2 | 7/2018 | Clerici et al. |
| 2010/0090565 A1* | 4/2010 | Bhaskaran ............ H01L 41/094 310/330 |
| 2014/0084395 A1 | 3/2014 | Sparks et al. |
| 2017/0325030 A1 | 11/2017 | Stoppel et al. |
| 2018/0153512 A1 | 6/2018 | Akkaraju et al. |
| 2018/0234783 A1 | 8/2018 | Clerici et al. |

(Continued)

FOREIGN PATENT DOCUMENTS

| | | |
|---|---|---|
| EP | 3247134 A1 | 11/2017 |
| WO | 2016/187480 A1 | 11/2016 |
| WO | WO 2019081220 A1 | 5/2019 |

*Primary Examiner* — Moazzam Hossain
(74) *Attorney, Agent, or Firm* — SEED IP LAW GROUP LLP

(57) ABSTRACT

A microelectromechanical membrane transducer includes: a supporting structure; a cavity formed in the supporting structure; a membrane coupled to the supporting structure so as to cover the cavity on one side; a cantilever damper, which is fixed to the supporting structure around the perimeter of the membrane and extends towards the inside of the membrane at a distance from the membrane; and a damper piezoelectric actuator set on the cantilever damper and configured so as to bend the cantilever damper towards the membrane in response to an electrical actuation signal.

20 Claims, 7 Drawing Sheets

(56) References Cited

U.S. PATENT DOCUMENTS

| | | | |
|---|---|---|---|
| 2018/0279053 A1 | 9/2018 | Clerici Beltrami et al. | |
| 2019/0082268 A1 | 3/2019 | Yoo | |
| 2019/0327562 A1* | 10/2019 | Cerini | B81B 3/0021 |
| 2020/0236470 A1* | 7/2020 | Cerini | H04R 1/025 |
| 2021/0119105 A1* | 4/2021 | Seghizzi | H01L 41/1136 |
| 2022/0209095 A1* | 6/2022 | Ikeuchi | H01L 41/313 |

* cited by examiner

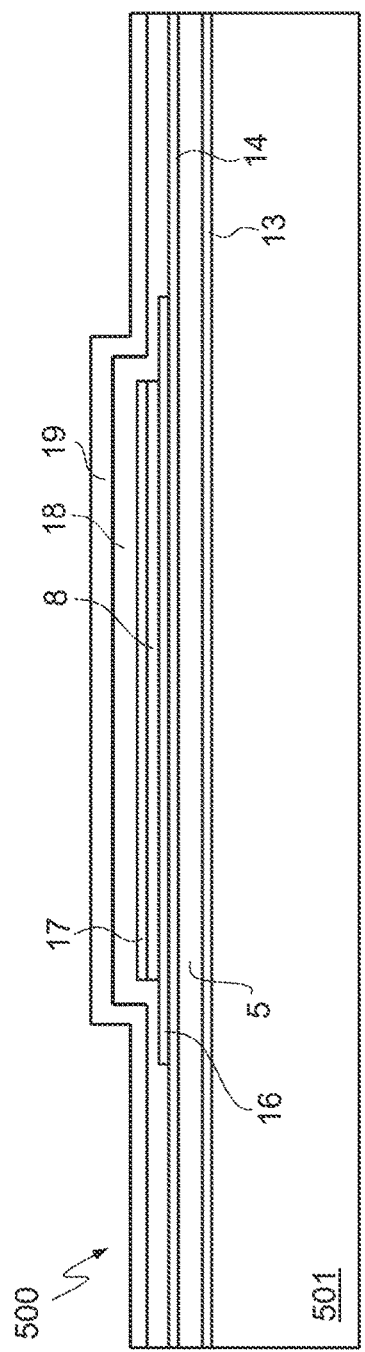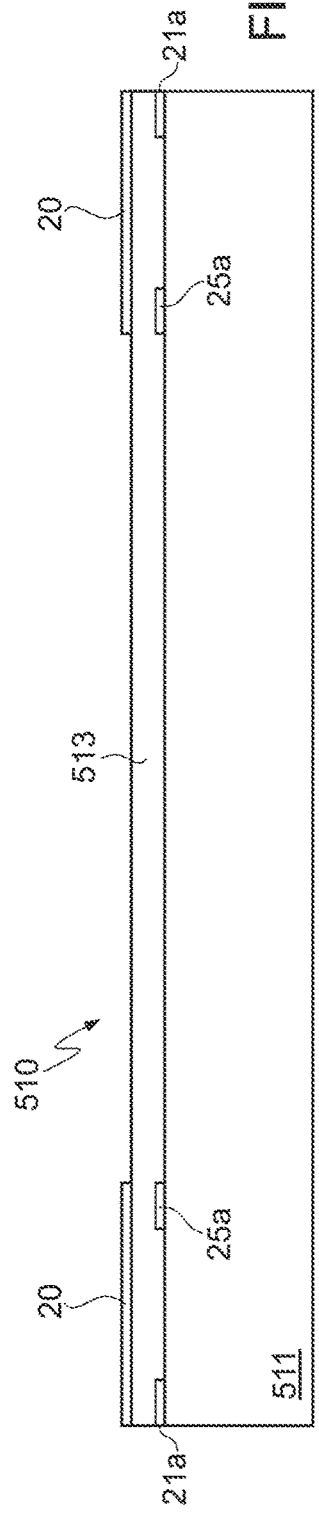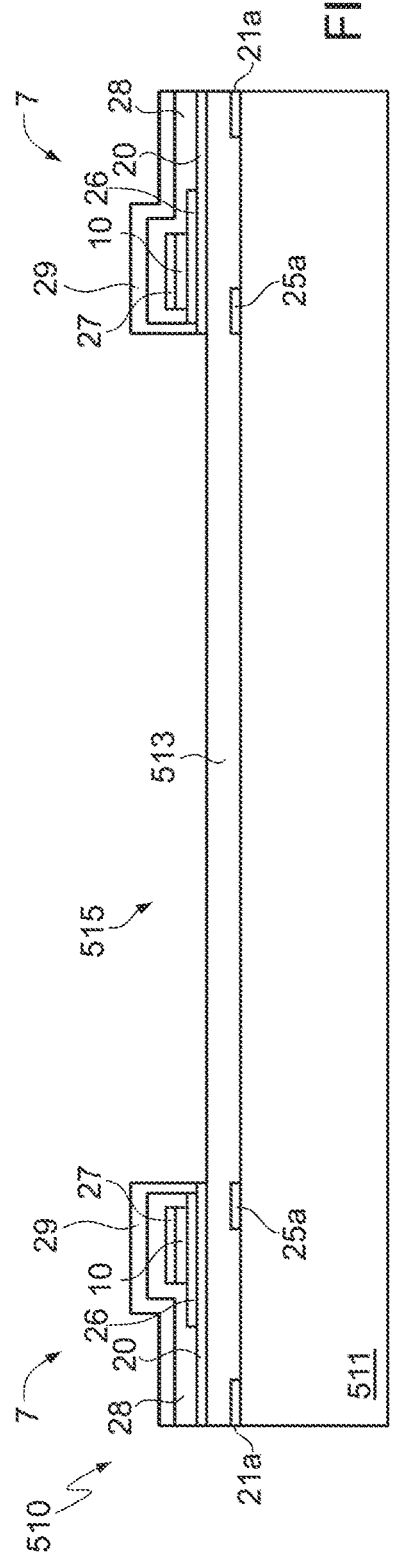

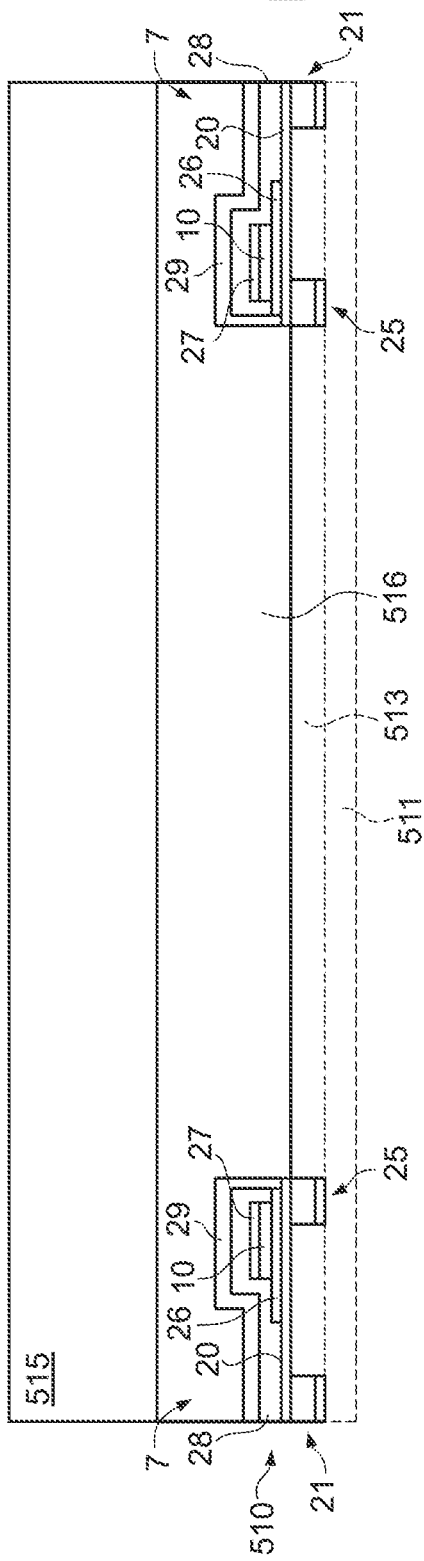
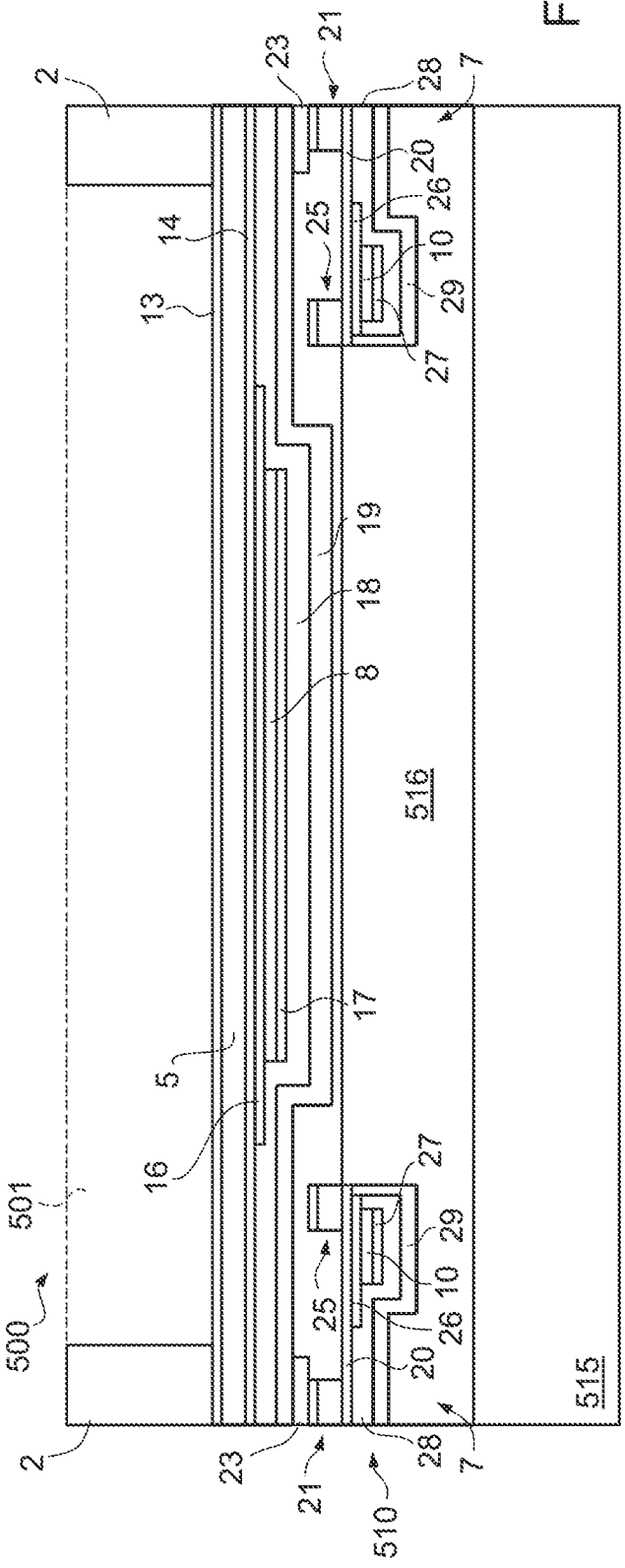

MICROELECTROMECHANICAL MEMBRANE TRANSDUCER WITH ACTIVE DAMPER

BACKGROUND

Technical Field

The present disclosure relates to a microelectromechanical membrane transducer, to a method for controlling a microelectromechanical membrane transducer, and to a process for manufacturing a microelectromechanical membrane transducer.

Description of the Related Art

As is known, microelectromechanical membrane transducers may be used in various sectors both for receiving and for generating pressure waves. Microelectromechanical transducers of this type may be used in a unidirectional way (for example, pressure sensors and microphones) or else in a bidirectional way, for example for providing ultrasound probes for various applications.

A microelectromechanical ultrasound transducer in general comprises a supporting structure of semiconductor material, formed in which is a cavity, and a membrane, which is also of semiconductor material, which closes the cavity on one side. A piezoelectric plate is formed on the membrane and is connected to a driving device that alternatively enables application of driving signals to the piezoelectric plate for generating pressure waves and for detecting oscillations of the membrane caused by return echoes of the pressure waves transmitted. In practice, the microelectromechanical transducer switches between a transmitting mode and a receiving mode. In the transmitting mode, the driving device excites the piezoelectric plate with a pulse train and causes vibration of the membrane, which produces pressure waves of controlled amplitude and frequency. In the receiving mode, the membrane is set in vibration by return echoes caused by variations in the density of the medium along the propagation path of the pressure waves emitted in the transmission step. The piezoelectric plate converts the oscillations of the membrane into a transduction signal, which is detected and amplified by the driving device.

A general problem of microelectromechanical membrane transducers lies in the time of damping of the oscillations of the membrane upon switching between the transmitting mode and the receiving mode, especially in applications "in air."

When the microelectromechanical transducer switches to the receiving mode, the membrane continues to vibrate (i.e., ring) and to produce a tail of pressure waves for a time determined by the damping factor, which in general is relatively low in order to obtain a higher sensitivity. On the one hand, the tail of pressure waves causes noise and may render processing of the return signals more complex. On the other hand, it is necessary to wait for the tail of pressure waves to vanish before the microelectromechanical transducer is ready to receive the return echoes in the receiving mode. This has repercussions on the depth of the blind area that cannot be investigated because the return echoes of possible obstacles present would be superimposed on to the tails of the pressure waves.

Solutions have been proposed, which, however, are not satisfactory above all because they are excessively sensitive to the variability in the manufacturing processes.

For instance, active suppression envisages detection of the oscillations of the membrane and application of driving signals in phase opposition, whereas filtering techniques during post-processing aim at eliminating the effects of the tails of pressure waves downstream of detection. In both cases, however, the effectiveness of the corrective actions is thus linked to the parameters of the individual microelectromechanical transducer and to the environmental conditions, which the unremovable spread of the manufacturing processes would force to calibrate and test each individual element produced, with consequent unsustainable costs.

BRIEF SUMMARY

The present disclosure provides a microelectromechanical membrane transducer, a method for controlling a microelectromechanical membrane transducer, and a process for manufacturing a microelectromechanical membrane transducer, which overcomes or mitigates, among others, the limitations described above.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein:

FIGS. 10-14 are cross-sectional views through semiconductor wafers in different processing steps of a process for manufacturing a microelectromechanical membrane transducer according to an embodiment of the present disclosure.

DETAILED DESCRIPTION

Figure 1:
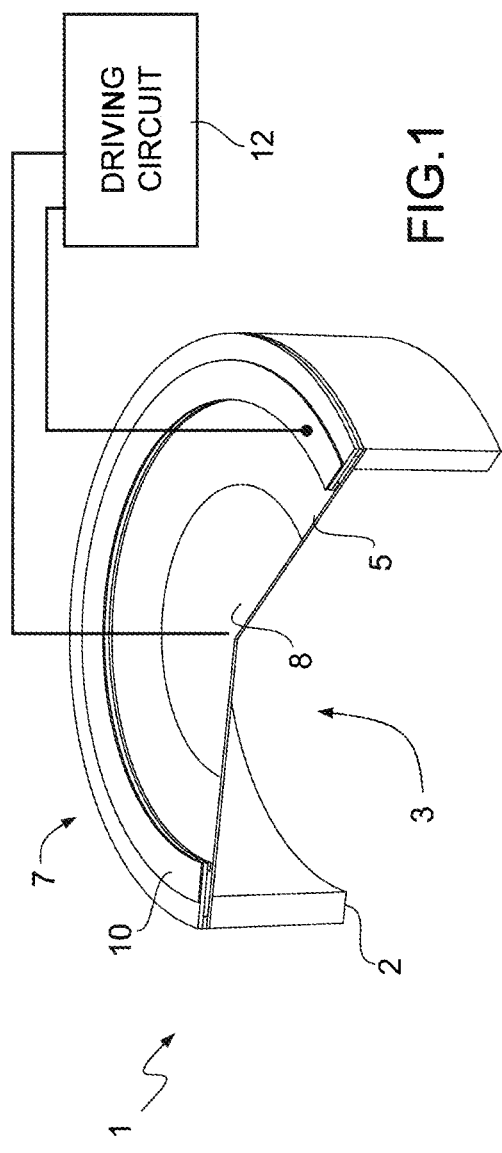
FIG. 1 is a partially sectioned perspective view of a microelectromechanical membrane transducer according to an embodiment of the present disclosure.

With reference to FIG. 1, number 1 designates as a whole a microelectromechanical membrane transducer according to an embodiment of the present disclosure. The microelectromechanical membrane transducer 1 comprises a supporting structure 2, within which a cavity 3 is formed, a membrane 5, coupled to the supporting structure 2 so as to cover the cavity 3 on one side, and a cantilever damper 7.

The microelectromechanical membrane transducer 1 further comprises a membrane piezoelectric actuator 8, a damper piezoelectric actuator 10, and a driving device 12 coupled to the membrane piezoelectric actuator 8 and to the damper piezoelectric actuator 10. In one embodiment (not illustrated), respective distinct driving circuits can be coupled to the membrane piezoelectric actuator 8 and to the damper piezoelectric actuator 10.

The supporting structure 2 is obtained from a substrate of semiconductor material and has, by way of non-limiting example, an annular shape. The cavity 3 extends through the entire supporting structure 2, is open on one side, and is covered by the membrane 5 on the other side.

The membrane 5 is connected along its perimeter to the supporting structure 2 and, in one embodiment, is of semiconductor material and is circular. For instance, the membrane 5 has a diameter between about 600 µm and about 800 µm and a thickness between about 0.5 µm and about 15 µm.

Figure 2:
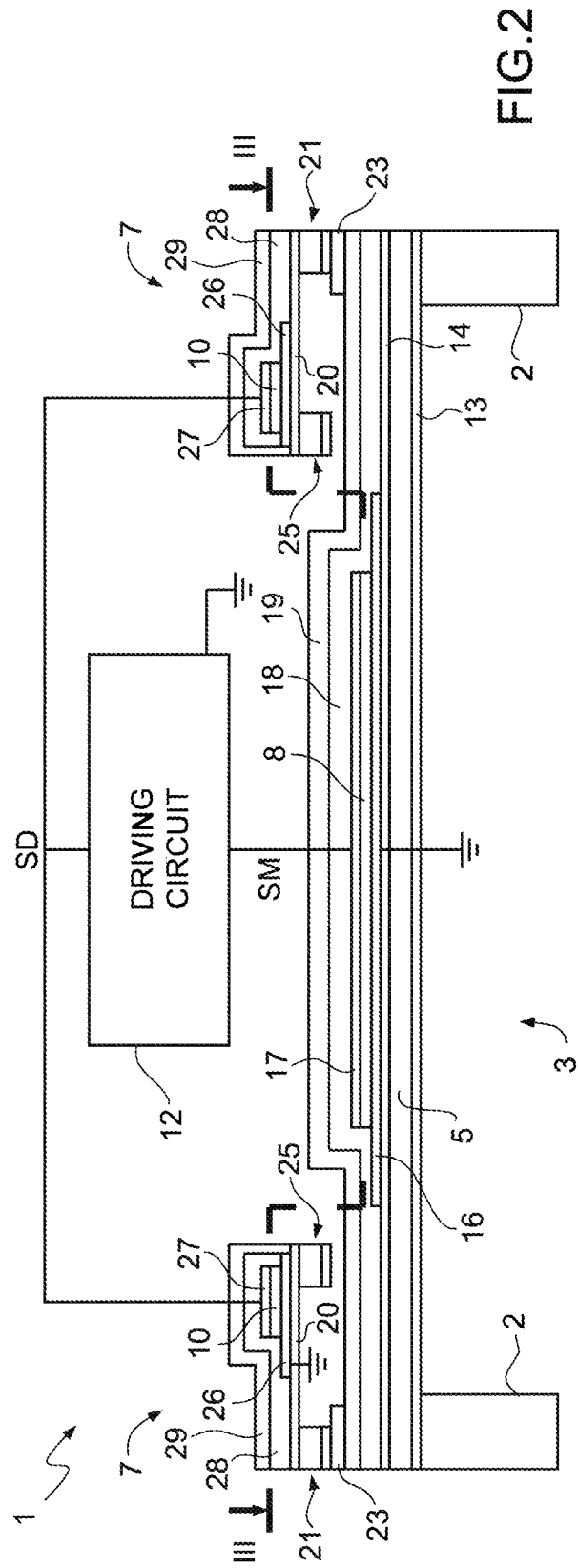
FIG. 2 is a cross-sectional view through the microelectromechanical membrane transducer represented in FIG. 1.

Opposite faces of the membrane 5 are coated with respective silicon-oxide protective layers 13, 14. In the example of FIGS. 1 and 2, the membrane 5 is continuous and has a circular shape. However, in some embodiments (not illustrated), the membrane 5 may be perforated and have an arbitrary shape, according to the design preferences.

In addition, the membrane piezoelectric actuator 8 is set at the center on the membrane 5 and comprises a plate of piezoelectric material between a first membrane electrode 16 and a second membrane electrode 17, which are coupled to the driving device 12 for alternatively supplying membrane-actuation signals SM and receiving reception signals SR. The piezoelectric material may, by way of non-limiting example, be PZT (Lead Zirconate Titanate). The membrane 5, the membrane piezoelectric actuator 8, and the membrane electrodes 16, 17 are coated with a passivation layer, for example a multilayer of USG (undoped silicate glass) 18 and silicon nitride 19.

The cantilever damper 7 comprises a bracket 20 of an annular shape, fixed to the supporting structure 2 around the perimeter of the membrane 5 and extending towards the inside of the membrane 5 at a distance therefrom. More precisely, an anchorage region 21, from which the bracket 20 protrudes, is joined to the supporting structure 2 by an adhesion layer 23 around the membrane 5. The bracket 20 projects, for example, by an amount of between about 100 µm and about 200 µm from the anchorage region 21 and has a thickness between about 0.5 µm and about 5 µm. A stopper element 25, which also has an annular shape, extends from the radially inner edge of the bracket 20 in the direction toward the membrane 5. In one embodiment, the anchorage region 21 and the stopper element 25 have the same structure; for example, they are of epitaxial silicon coated with silicon oxide on the side facing the membrane 5. When the membrane 5 is at rest and the damper piezoelectric actuator 10 is not activated, the stopper element 25 is located, for example, at a distance of approximately 1 µm from the membrane 5.

The damper piezoelectric actuator 10 comprises a continuous annular region of piezoelectric material, for example PZT, set on the cantilever damper 7 along an inner perimetral edge thereof, in particular on a face of the bracket 20 opposite to the membrane 5 and comprised between a first damper electrode 26 and a second damper electrode 27. For instance, the annular region of piezoelectric material has a thickness (perpendicular to the membrane 5) between about 0.5 µm and about 3 µm and a width between about 80 µm and about 1000 µm, in a direction parallel to the membrane 5. In the case illustrated, where the annular region of piezoelectric material has an annular shape, the width is the difference between the outer radius and the inner radius.

A passivation layer, for example a multilayer of USG 28 and silicon nitride 29 coats the damper piezoelectric actuator 10, the damper electrodes 26, 27, and the remaining portion of the bracket 20.

Figure 4:
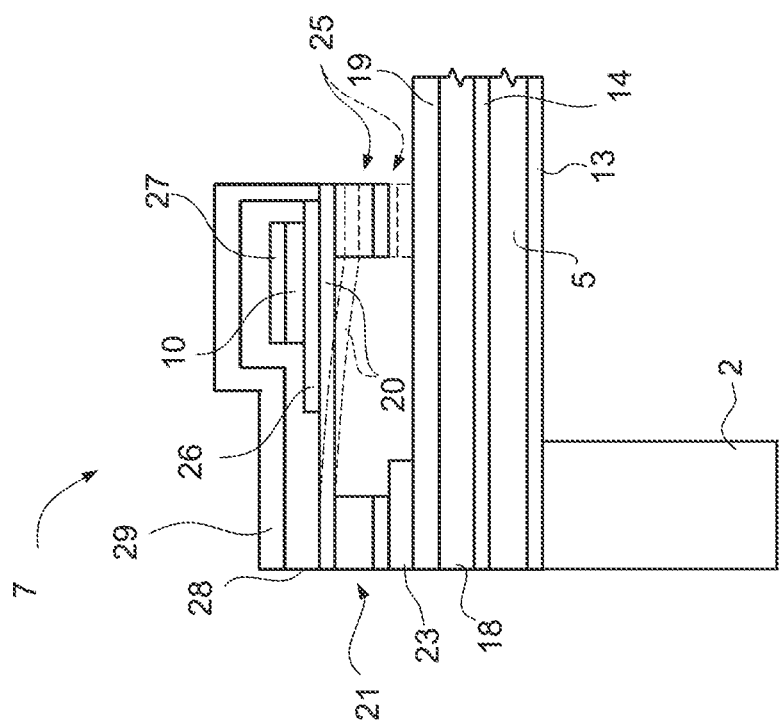
FIG. 4 shows an enlarged detail of FIG. 2.
Figure 3:
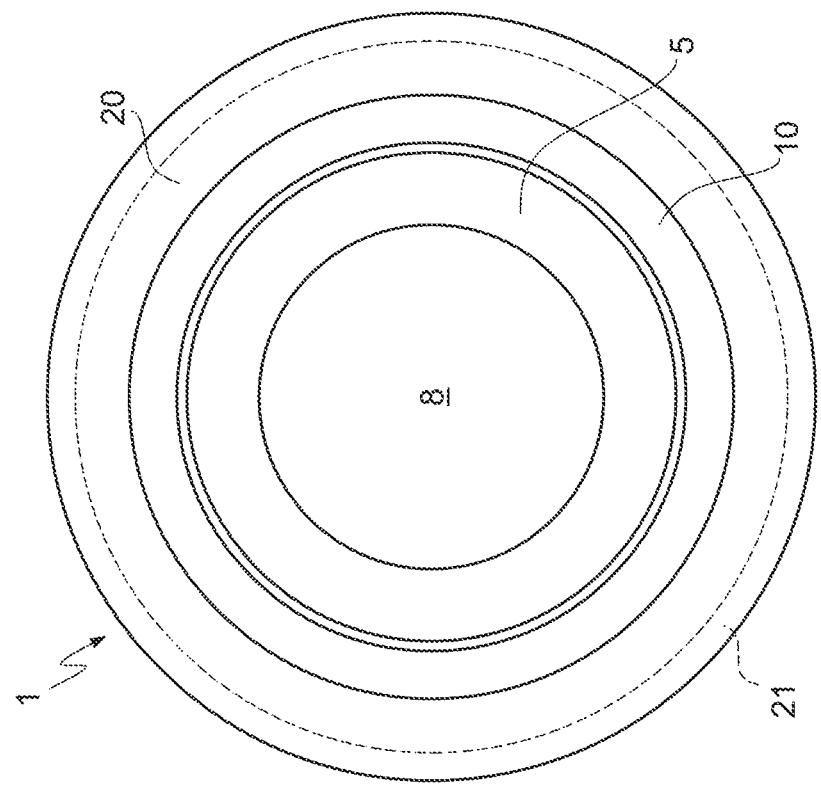
FIG. 3 is a top view, sectioned along the line of FIG. 2 and with parts removed for clarity, of the microelectromechanical membrane transducer of FIG. 1.

The damper piezoelectric actuator 10 is configured to bend the cantilever damper 7, in particular the bracket 20, towards the membrane 5 in response to a damper-actuation signal SD, as illustrated in FIG. 4. In one embodiment, the damper piezoelectric actuator 7 extends along a radially inner margin of the bracket 20. Bending of the bracket 20 brings the stopper element 25 into contact with the membrane 5 and in practice causes an increase of the damping coefficient of the oscillating system. Activation of the damper piezoelectric actuator 7 thus reduces the time of suppression of the oscillations of the membrane.

Figure 5C:
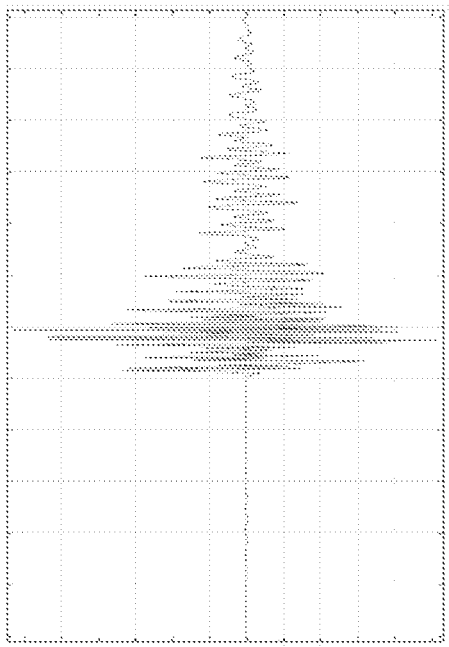
FIG. 5c is a graph showing a second quantity regarding the microelectromechanical membrane transducer of FIG. 1, in the first operating condition.
Figure 5D:
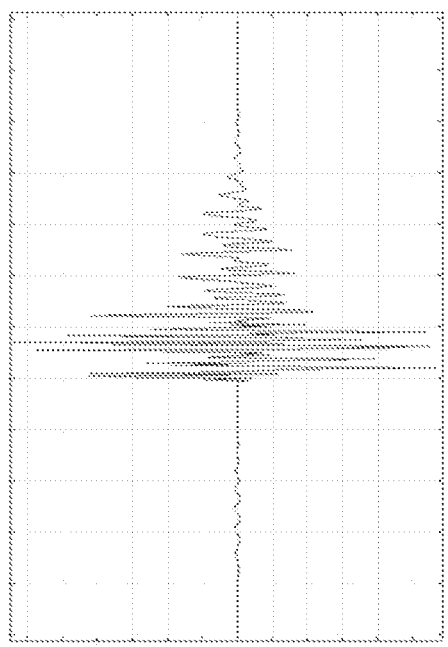
FIG. 5d is a graph showing the second quantity, in the second operating condition.
Figure 5A:
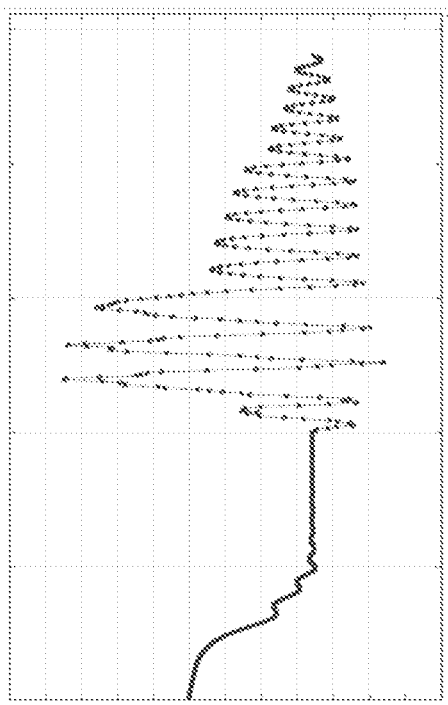
FIG. 5a is a graph showing a first quantity regarding the microelectromechanical membrane transducer of FIG. 1, in a first operating condition.
Figure 5B:
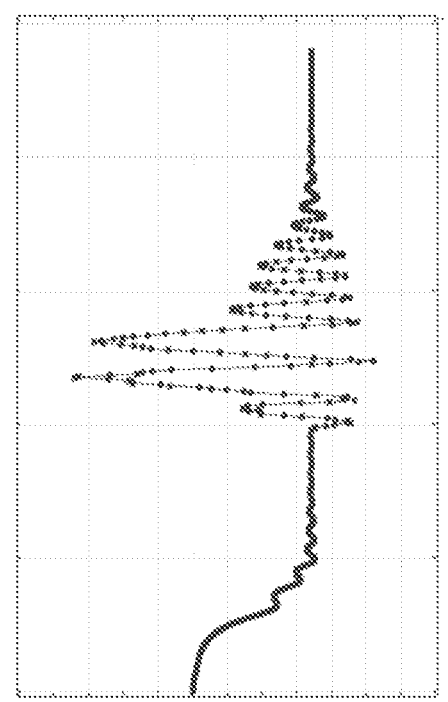
FIG. 5b is a graph showing the first quantity, in a second operating condition.

FIGS. 5a-5d show the comparison between the behaviour of the membrane 5 with and without intervention of the damper piezoelectric actuator 7. More precisely, FIGS. 5a and 5b show the amplitude of oscillation of the membrane 5, whereas FIGS. 5c and 5d show the pressure in air at a reference distance from the plane of the membrane 5 at rest. The graphs of FIGS. 5a and 5c are obtained without activation of the membrane piezoelectric actuator 7. The graphs of FIGS. 5b and 5d are obtained with the membrane piezoelectric actuator 7 activated and clearly show the effect thereof in terms of reduction of the oscillation damping time.

The driving device 12 is configured to apply membrane-actuation signals SM to the membrane piezoelectric actuator 8, in a transmitting mode, and to receive and amplify reception signals SR generated by the membrane piezoelectric transducer 8 as a result of the oscillations of the membrane 5. The driving device 12 switches between the transmitting mode, where the membrane piezoelectric transducer 12 is used for transmitting a packet of pressure waves, and the receiving mode, where the membrane piezoelectric transducer 8 is used for detecting echoes due to reflection of the pressure waves transmitted onto obstacles set along the propagation path.

Furthermore, the driving device 12 is configured to apply damper-actuation signals SD to the damper piezoelectric actuator 10. In response to the damper-actuation signals SD, the damper piezoelectric actuator 10 causes bending of the bracket 20, and the stopper element 25 comes into contact with the membrane 5 and causes a faster damping of the oscillations.

Figure 6A:
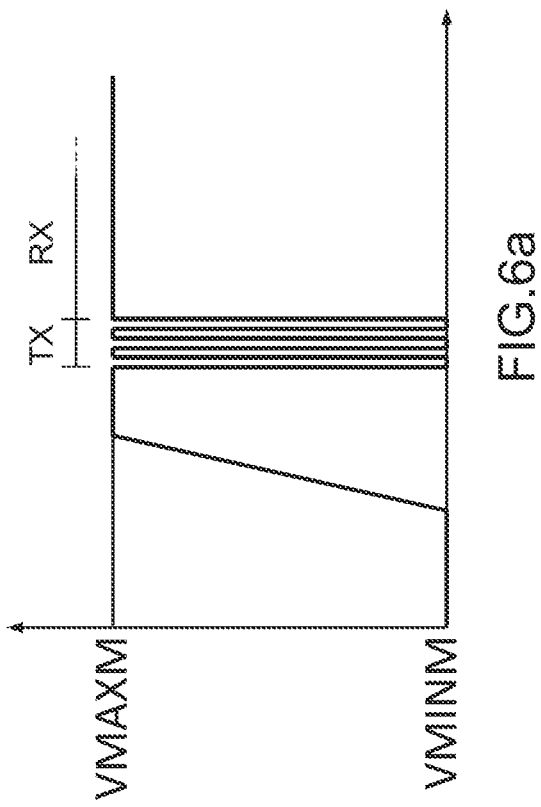
FIG. 6a is a graph showing a first control quantity used in the microelectromechanical membrane transducer of FIG. 1.
Figure 6B:
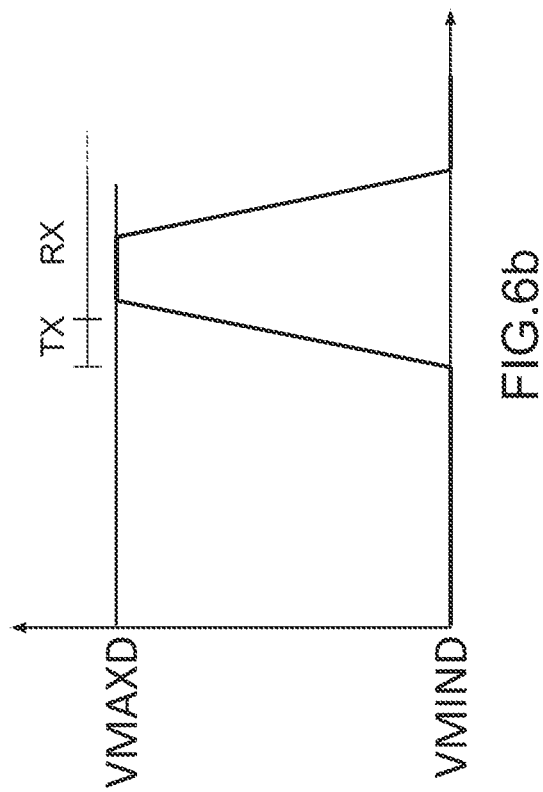
FIG. 6b is a graph showing a second control quantity used in the microelectromechanical membrane transducer of FIG. 1.

The membrane-actuation signals SM and the damper-actuation signals SD may be synchronised, as indicated in FIGS. 6a and 6b. In particular, a membrane-actuation signal SM (FIG. 6a) increases according to a ramp from a minimum membrane value VMINM to a maximum membrane value VMAXM and, after a settling interval, oscillates between the minimum membrane value VMINM and the maximum membrane value VMAXM for a number of programmed cycles. The damper-actuation signal SD (FIG. 6b) increases according to a ramp from a minimum damper value VMIND to a maximum damper value VMAXD so as to bring the stopper element 25 gradually into contact with the membrane 5 immediately after the number of programmed cycles of the membrane-actuation signal SM has been completed. In particular, contact occurs before the transient of natural damping of the oscillations of the membrane 5 is over (i.e., without intervention of the damper piezoelectric actuator 10). Start of the ramp is selected so that the contact of the stopper element 25 with the membrane 5 occurs at a desired instant. When the transient of damping of the oscillations of the membrane 5 is over, the damper-actuation signal SD decreases according to a ramp from the maximum damper value VMAXD to the minimum damper value VMIND so as to interrupt gradually the contact between the stopper element 25 and the membrane 5. Gradual contact (primarily) and gradual detachment (secondarily) between the stopper element 25 and the membrane 5 prevent perturbation of the state of the membrane 5 itself, which is soon ready for the receiving mode.

Figure 7:
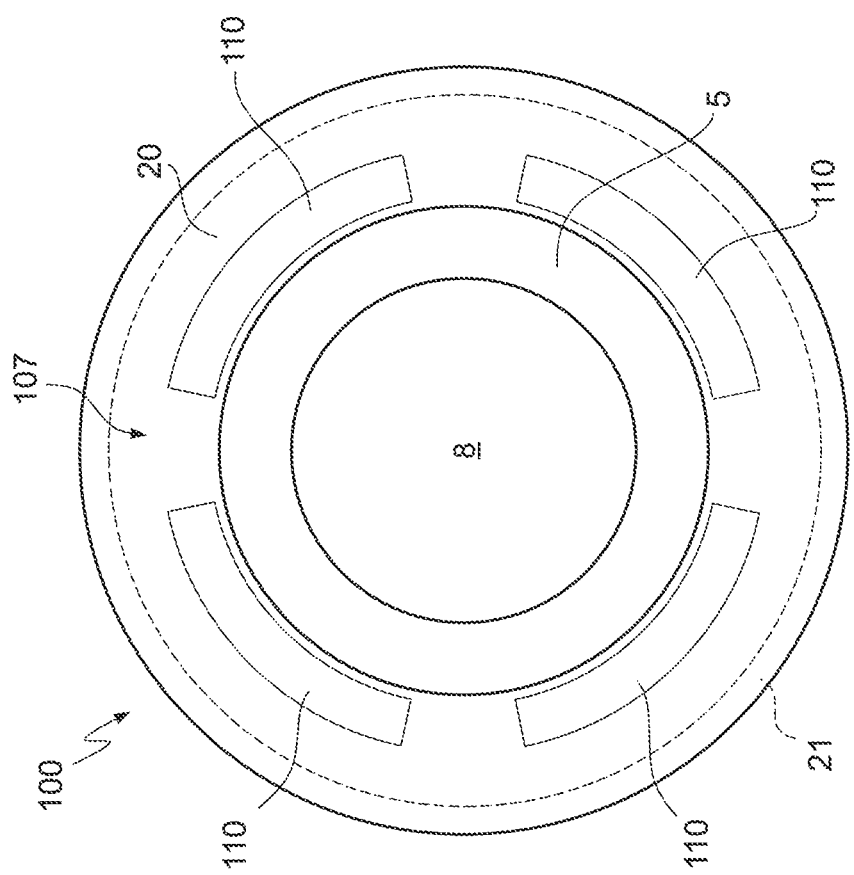
FIG. 7 is a top view, with parts removed for clarity, of a microelectromechanical membrane transducer according to a different embodiment of the present disclosure.

In the embodiment of FIG. 7, where parts that are the same as the ones already illustrated are designated by the same reference numbers, a microelectromechanical membrane transducer 100 comprises a discontinuous damper piezoelectric actuator 110, defined by a plurality of distinct regions of piezoelectric material, each extending in the form of an annular sector along a respective portion of the inner perimetral edge of the cantilever damper 107. The portions of the damper piezoelectric actuator 110 are concentric and have the same radius and, moreover, are individually connected to the driving device 12. In one embodiment, the portions of the damper piezoelectric actuator 110 can be controlled independently by the driving device 12.

Figure 8:
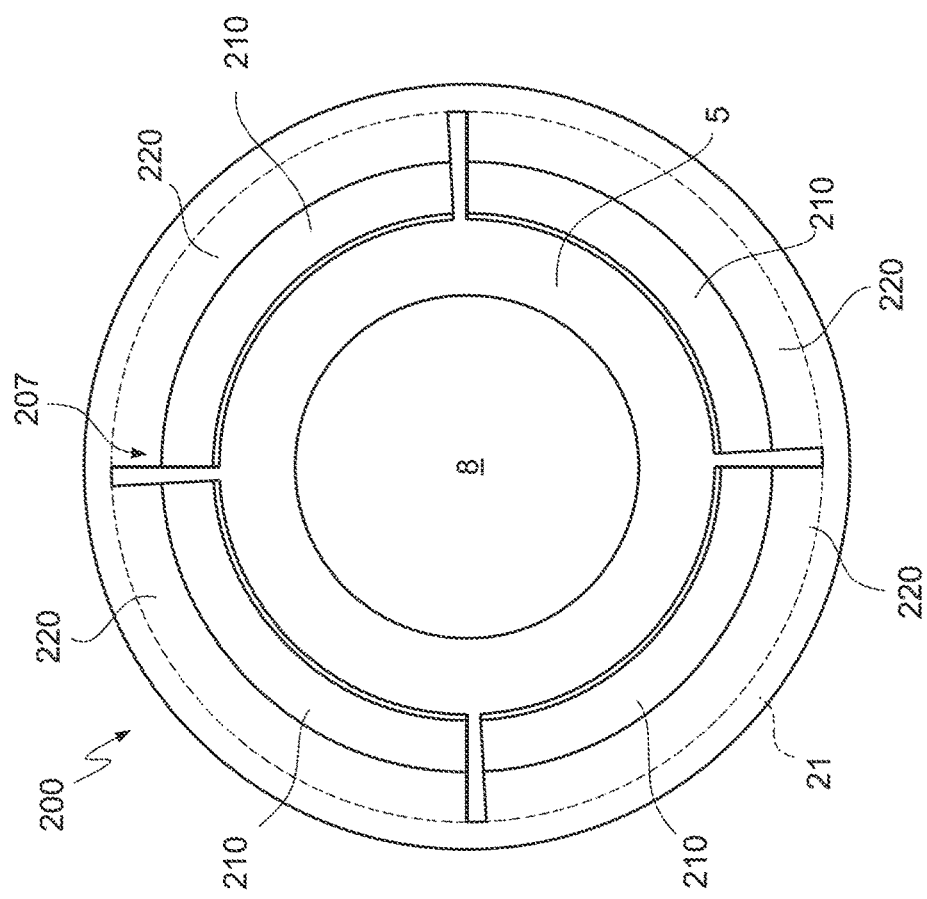
FIG. 8 is a top view, with parts removed for clarity, of a microelectromechanical membrane transducer according to a further embodiment of the present disclosure.

With reference to FIG. 8, in a microelectromechanical membrane transducer 200 according to one embodiment of the disclosure, the cantilever damper 207 comprises a plurality of brackets 220, which extend from respective anchorage regions 221 towards the membrane 5 and are shaped like annular sectors along respective portions of the perimeter of the membrane 5. The brackets 220 are separated from one another by gaps 221. Each bracket 220 is provided with a respective damper piezoelectric actuator 210, which comprises a region of piezoelectric material extending along a respective annular sector. The damper piezoelectric actuators 210 can be controlled separately by the driving device 12.

Figure 9:
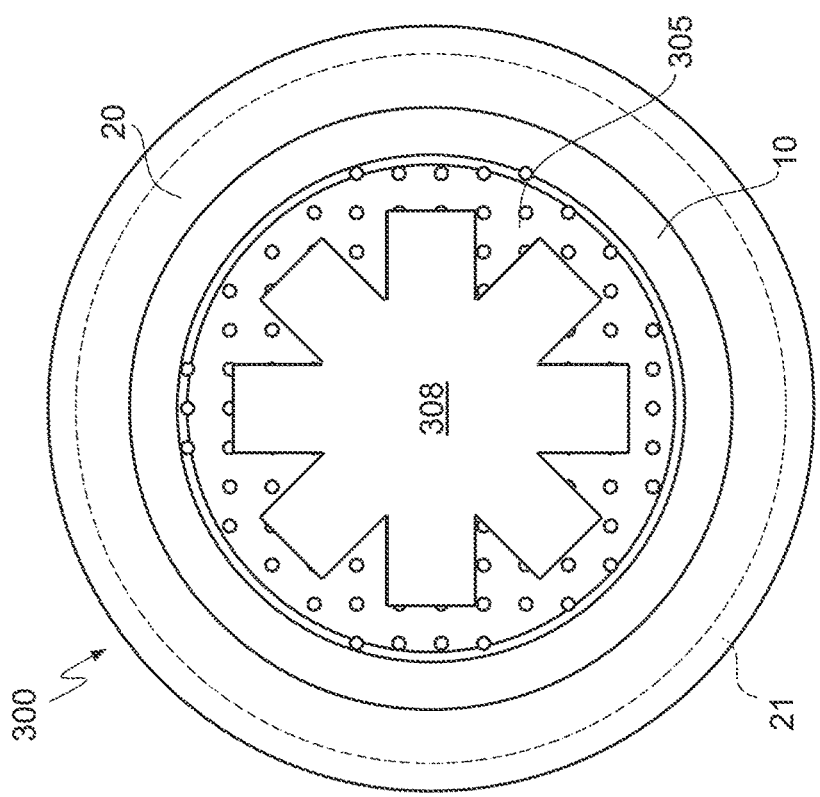
FIG. 9 is a top view, with parts removed for clarity, of a microelectromechanical membrane transducer according to a further embodiment of the present disclosure.

FIG. 9 shows a microelectromechanical membrane transducer 300 according to an embodiment of the disclosure. The microelectromechanical membrane transducer 300 comprises a perforated membrane 305 and a membrane piezoelectric transducer 308 having a star shape, with radial arms. In further embodiments (not illustrated), the damper piezoelectric actuator may comprise concentric regions of piezoelectric material having a circular shape or the shape of an annular sector.

A process for manufacturing the membrane piezoelectric transducer 1 is schematically illustrated in FIGS. 10-14.

A first semiconductor wafer 500 (FIG. 10) comprises a substrate 501 of monocrystalline silicon, on which the protective layer 13, the structure of the membrane 5 (for example, via growth of a pseudo-epitaxial layer of monocrystalline silicon, the membrane 5 will be released thereafter) and the protective layer 14 are formed in succession. Next, a stack formed by a layer of platinum, a layer of piezoelectric material (for example PZT), and a layer of titanium and tungsten alloy (TiW) is deposited on the protective layer 14 and defined to form the first membrane electrode 16, the membrane piezoelectric actuator 8, and the second membrane electrode 17. Then, the passivation layer is provided by depositing the layer of USG 18 and the layer of silicon nitride 19.

A second semiconductor wafer 510 (FIG. 11) comprises a substrate 511 of monocrystalline silicon. A silicon-oxide layer is formed on the substrate 511 and defined so as to leave anchorage regions 21a and stopper regions 25a where the anchorage region 21 and the stopper element 25 will subsequently be formed. An epitaxial layer 513 is then grown, and a silicon-oxide layer is formed on the epitaxial layer 513 and subsequently defined for providing the bracket 20, with a central opening 515 corresponding to the membrane 5.

Next, a stack formed by a layer of platinum, a layer of piezoelectric material (for example, PZT) and a layer of titanium and tungsten alloy (TiW) is deposited on the protective layer 14 and defined to form the first damper electrode 26, the damper piezoelectric actuator 10, and the second damper electrode 27.

Then, the passivation layer is obtained by depositing the USG layer 28 and the silicon-nitride layer 29 so as to coat the damper piezoelectric actuator 10, the damper electrodes 26, 27, and the remaining portion of the bracket 20. Within the bracket 20, the passivation layer is selectively removed.

The second semiconductor wafer 510 is then joined to an auxiliary supporting wafer 515 by an adhesion layer 516, and the substrate 511 is thinned out to a controlled thickness.

Next, the substrate 511 and the epitaxial layer 513 are etched with an anisotropic dry etch. In this step, the substrate 511 is removed completely, whereas the epitaxial layer 513 is partially protected by the anchorage regions 21a and the stopper regions 25a. The anchorage region 21 and the stopper element 25 are thus formed.

The first semiconductor wafer 500 and the second semiconductor wafer 510 are joined together by the adhesion layer 23, are flipped over, and the substrate 501 of the first semiconductor wafer 500 is anisotropically etched with a dry etch, until one side of the membrane 5 is released.

Finally, the second semiconductor wafer 510 is separated from the auxiliary supporting wafer 515 by removing the adhesion layer 516. The structure of the membrane piezoelectric transducer 1 illustrated in FIG. 2 is thus obtained.

Finally, it is evident that modifications and variations may be made to the microelectromechanical membrane transducer, to the control method, and to the manufacturing process described herein, without thereby departing from the scope of the present disclosure.

A microelectromechanical membrane transducer may be summarized as including a supporting structure (2); a cavity (3) formed in the supporting structure (2); a membrane (5; 305) coupled to the supporting structure (2) so as to cover the cavity (3) on one side; a cantilever damper (7), which is fixed to the supporting structure (2) around the perimeter of the membrane (5; 305) and extends towards the inside of the membrane (5; 305) at a distance from the membrane (5; 305); and a damper piezoelectric actuator (10; 110; 210), arranged on the cantilever damper (7) and configured so as to bend the cantilever damper (7) towards the membrane (5; 305) in response to an electrical actuation signal (SD).

The damper piezoelectric actuator (10; 110; 210) may extend along an inner perimetral edge of the cantilever damper (7).

The damper piezoelectric actuator (10) may be continuous along the entire inner perimetral edge of the cantilever damper (7).

The damper piezoelectric actuator (110; 210) may include a plurality of distinct regions of piezoelectric material, each arranged along a respective portion of the perimeter of the inner perimetral edge of the cantilever damper (7).

The cantilever damper (7) may include a bracket (5; 305) fixed to the supporting structure (2) along a perimeter of the membrane (5; 305) and wherein the damper piezoelectric actuator (110; 210) is set on a face of the bracket (5; 305).

The cantilever damper (7) may include a stopper element (25) extending from an inner edge of the bracket (20) towards the membrane (5) and wherein the damper piezoelectric actuator (110) is set on a face of the bracket (5; 305) opposite to the membrane (5).

The cantilever damper (7) may include an anchorage region (21), joined to the supporting structure (2) by an adhesion layer (23) around the membrane (5) and wherein the bracket (20) protrudes from the anchorage region (21).

The cantilever damper (207) may include a plurality of brackets (220), which extend from respective anchorage regions (221) towards the membrane (5) along respective portions of the perimeter of the membrane (5) and wherein each bracket (220) is provided with a respective damper piezoelectric actuator (210).

The transducer may include a driving device (12) configured to apply the electrical actuation signals (SD) to the damper piezoelectric actuator (10; 110; 210).

Each portion of the damper piezoelectric actuator (110) may be independently controlled by the driving device (12).

Each damper piezoelectric actuator (210) may be independently controlled by the driving device (12).

The transducer may include a membrane piezoelectric actuator (8; 308) on a face of the membrane (5; 30), wherein the driving device (12) is configured to alternatively apply membrane-actuation signals (SM) to the membrane piezoelectric actuator (8; 308) in a transmitting mode and to receive reception signals (SR) from the membrane piezoelectric actuator (8; 308) in a receiving mode.

The driving device (12) may be configured to cause oscillation of the membrane-actuation signal (SM) between a first membrane value (VMINM) and a second membrane value (VMAXM) for a programmed number of cycles and to modify according to a ramp the damper-actuation signal (SD) between a first damper value (VMIND) and a second damper value (VMAXD) so as to bring the cantilever damper (7) gradually into contact with the membrane (5; 305) after the programmed number of cycles of the membrane-actuation signal (SM) has been completed.

A method for controlling a microelectromechanical membrane transducer may be summarized as including forcing a programmed number of cycles of oscillation of the membrane (5; 305); and bringing the cantilever damper (7) into contact with the membrane (5; 305) after the programmed number of cycles of oscillation of the membrane (5; 305) has been completed and before a transient of damping of the oscillations of the membrane (5; 305) is over.

A process for manufacturing a microelectromechanical membrane transducer may be summarized as including forming a structure of a membrane (5) on a first substrate (501) of a first semiconductor wafer (500); forming a cantilever damper (7) on a second substrate (511) of a second semiconductor wafer (510), with a central opening (515) in a position corresponding to the structure of the membrane (5); joining the first semiconductor wafer (500) and the second semiconductor wafer (510) with the structure of the membrane (5) facing the cantilever-damper structure (7); and releasing the membrane (5; 305), wherein forming the cantilever damper (7) comprises forming a damper piezoelectric actuator (10; 110; 210) configured so as to bend the cantilever damper (7) towards the membrane (5; 305) in response to an electrical actuation signal (SD).

The various embodiments described above can be combined to provide further embodiments. Aspects of the embodiments can be modified to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical membrane transducer, comprising:
    a supporting structure;
    a cavity in the supporting structure;
    a membrane coupled to the supporting structure and covering a portion of the cavity;
    a cantilever damper coupled to the supporting structure around a perimeter of the membrane and extending in a first direction towards a center of the membrane and at a distance in a second direction from the membrane, the second direction is transverse to the first direction, the cantilever damper is spaced apart from the membrane in the second direction in a resting position, and the cantilever damper is configured to, in operation, be deformed in the second direction away from the resting position towards the membrane and towards an active position of the cantilever damper in which the cantilever damper abuts the membrane; and
    a damper piezoelectric actuator on the cantilever damper, the damper piezoelectric actuator is configured to, in operation, deform the cantilever damper from the resting position to the active position.

2. The transducer according to claim 1, wherein the damper piezoelectric actuator extends along an inner perimetral edge of the cantilever damper.

3. The transducer according to claim 2, wherein the damper piezoelectric actuator is continuous along an entire perimeter of the inner perimetral edge of the cantilever damper.

4. The transducer according to claim 2, wherein the damper piezoelectric actuator comprises a plurality of distinct regions of piezoelectric material, each arranged along a respective portion of a perimeter of the inner perimetral edge of the cantilever damper.

5. The transducer according to claim 1, wherein the cantilever damper comprises a bracket fixed to the supporting structure along a perimeter of the membrane and wherein the damper piezoelectric actuator is set on a face of the bracket.

6. The transducer according to claim 5, wherein the cantilever damper comprises a stopper element extending from an inner edge of the bracket toward the membrane and wherein the damper piezoelectric actuator is set on a face of the bracket opposite to the membrane.

7. The transducer according to claim 5, wherein the cantilever damper comprises an anchorage region joined to the supporting structure by an adhesion layer around the membrane and wherein the bracket protrudes from the anchorage region.

8. The transducer according to claim 5, wherein the cantilever damper comprises a plurality of brackets extending from respective anchorage regions toward the membrane along respective portions of a perimeter of the membrane and wherein each bracket is provided with a respective damper piezoelectric actuator.

9. The transducer according to claim 1, comprising a driving device configured to apply an electrical actuation signal to the damper piezoelectric actuator to bend the cantilever damper.

10. The transducer according to claim 4, comprising a driving device configured to apply an electrical actuation signal to the damper piezoelectric actuator, wherein each portion of the damper piezoelectric actuator is independently controlled by the driving device.

11. The transducer according to claim 8, comprising a driving device configured to apply an electrical actuation signal to each damper piezoelectric actuator independently.

12. The transducer according to claim 9, comprising a membrane piezoelectric actuator on a face of the membrane, wherein the driving device is configured to alternatively apply membrane-actuation signals to the membrane piezoelectric actuator in a transmitting mode and to receive reception signals from the membrane piezoelectric actuator in a receiving mode.

13. The transducer according to claim 12, wherein the driving device is configured to cause oscillation of the membrane-actuation signal between a first membrane value and a second membrane value for a programmed number of cycles and to modify according to a ramp the damper-actuation signal between a first damper value and a second damper value so as to bring the cantilever damper gradually into contact with the membrane after the programmed number of cycles of the membrane-actuation signal has been completed.

14. A microelectromechanical membrane transducer, comprising:
    a cavity in a substrate;
    a membrane over the cavity;
    a cantilever damper over a perimeter of the membrane, the cantilever damper including a first end and a second end, the first end being coupled to the substrate, the second end overlapping the cavity and being separated from the membrane with a distance, the cantilever damper is suspended over and spaced apart from the membrane in a resting position, the cantilever damper overlaps the perimeter of the membrane;
    a damper piezoelectric actuator on the cantilever damper; and
    a membrane piezoelectric actuator on a central region of the membrane spaced inward from the perimeter of the membrane and spaced inward from the second end of the cantilever damper.

15. The transducer according to claim 14, wherein the second end of the cantilever damper is spaced inward from the perimeter of the membrane, is spaced outward from the membrane piezoelectric actuator, and is between the perimeter of the membrane and the membrane piezoelectric actuator.

16. The transducer according to claim 14, wherein the membrane piezoelectric actuator includes a first membrane electrode, a second membrane electrode and a plate of piezoelectric material between the first membrane electrode and the second membrane electrode.

17. The transducer according to claim 14, further comprising a passivation layer over the membrane, the membrane piezoelectric actuator between the passivation layer and the membrane.

18. The transducer of claim 17, wherein the passivation layer includes an undoped silicate glass layer and a silicon nitride layer.

19. A device, comprising:
    microelectromechanical membrane transducer having:
        a support;
        a cavity in the support;
        a membrane coupled to the support;
        a cantilever damper coupled to the support around a perimeter of the membrane, the cantilever damper extending towards a center of the membrane from the perimeter, the cantilever damper including a stopper element at an end of the cantilever damper, the stopper element is spaced apart from and is suspended from the membrane in a resting position; and
        a damper piezoelectric actuator is within the cantilever damper, is spaced apart from and is suspended from the membrane by the cantilever damper, overlaps the membrane, and is configured to, in operation, deform the cantilever damper towards the membrane to an active position at which the cantilever damper abuts the membrane.

20. The device of claim 19, wherein the damper piezoelectric actuator is entirely spaced inward from the perimeter of the membrane.

* * * * *